US012647110B2

(12) United States Patent
Bernardon et al.

(10) Patent No.: US 12,647,110 B2
(45) Date of Patent: Jun. 2, 2026

(54) POWER SEMICONDUCTOR DEVICE CURRENT SENSING

(71) Applicant: Infineon Technologies Austria AG, Villach (AT)

(72) Inventors: Derek Bernardon, Villach (AT); Markus Seebacher, Wernberg (AT); Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 77 days.

(21) Appl. No.: 18/894,573

(22) Filed: Sep. 24, 2024

(65) Prior Publication Data

US 2026/0088814 A1     Mar. 26, 2026

(51) Int. Cl.
*H03K 17/0814* (2006.01)
(52) U.S. Cl.
CPC .................. *H03K 17/08142* (2013.01); *H03K 2217/0027* (2013.01)
(58) Field of Classification Search
CPC ................ H03K 17/08142; H03K 2217/0027
USPC ................................................ 327/108, 109
See application file for complete search history.

(56) References Cited

U.S. PATENT DOCUMENTS

| | | | | |
|---|---|---|---|---|
| 10,031,541 B1 | 7/2018 | Bernardon | | |
| 2015/0084613 A1* | 3/2015 | Ho | ...................... | H02M 3/1588 |
| | | | | 323/299 |
| 2020/0379018 A1* | 12/2020 | Zhou | ................... | G01R 19/003 |
| 2024/0201231 A1* | 6/2024 | Bernardon | .......... | H02M 1/0009 |
| 2024/0203981 A1* | 6/2024 | Bernardon | ....... | G01R 19/16519 |

* cited by examiner

*Primary Examiner* — William Hernandez
(74) *Attorney, Agent, or Firm* — Cooper Legal Group LLC

(57) ABSTRACT

According to some embodiments, a load powering circuit includes a power circuit having a power semiconductor device, a mirror circuit connected to power semiconductor device and configured to generate a mirror current signal based on current flowing through the power semiconductor device, and a drain switch having an input connected to a drain of the power semiconductor device, and a driver circuit having an amplifier having a first input terminal and a second input terminal connected to the mirror circuit, and a gate control terminal connected to the power semiconductor device, the mirror circuit, and the drain switch, wherein the drain switch has an output connected to a negative reference terminal of the amplifier, and a voltage supply terminal is connected to a positive reference terminal of the amplifier.

20 Claims, 6 Drawing Sheets

POWER SEMICONDUCTOR DEVICE CURRENT SENSING

TECHNICAL FIELD

The present disclosure relates generally to electronic circuits, and, more particularly, to current sensing in a power semiconductor device.

BACKGROUND

A power semiconductor device comprises a semiconductor structure configured to conduct a load current along a load current path between two load terminal structures of the device. The load current path may be controlled by a driver that enables a gate electrode of the power semiconductor device.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

According to some embodiments, a load powering circuit comprises a power circuit comprising a power semiconductor device, a mirror circuit connected to power semiconductor device and configured to generate a mirror current signal based on current flowing through the power semiconductor device, and a drain switch having an input connected to a drain of the power semiconductor device, and a driver circuit comprising an amplifier having a first input terminal and a second input terminal connected to the mirror circuit, and a gate control terminal connected to the power semiconductor device, the mirror circuit, and the drain switch, wherein the drain switch has an output connected to a negative reference terminal of the amplifier, and a voltage supply terminal is connected to a positive reference terminal of the amplifier.

According to some embodiments, a driver circuit comprises an amplifier, a gate control terminal, a source mirror terminal connected to a first input of the amplifier, a drain mirror terminal connected to a second input of the amplifier, a gate protection terminal, a gate protection circuit connected to the gate protection terminal and the gate control terminal, a drain mirror terminal connected to a negative reference terminal of the amplifier, and a voltage supply terminal connected to a positive reference terminal of the amplifier, wherein the amplifier is configured to measure a current flowing between the source mirror terminal and the drain mirror terminal responsive to a gate signal on the gate control terminal.

According to some embodiments, a load powering circuit comprises a power circuit comprising a power semiconductor device, a mirror circuit connected to power semiconductor device and configured to generate a mirror current signal based on current flowing through the power semiconductor device, a first sense transistor having an input connected to a drain of the power semiconductor device, and a second sense transistor having an input connected to a drain of the current mirror, and a driver circuit comprising a first amplifier having a first input terminal connected to the first sense transistor and a second input terminal connected to the second sense transistor and generating an output based on a negative current flowing through the power semiconductor device, and a second amplifier having a first input terminal and a second input terminal connected to the mirror circuit and generating an output based on a positive current flowing through the power semiconductor device.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
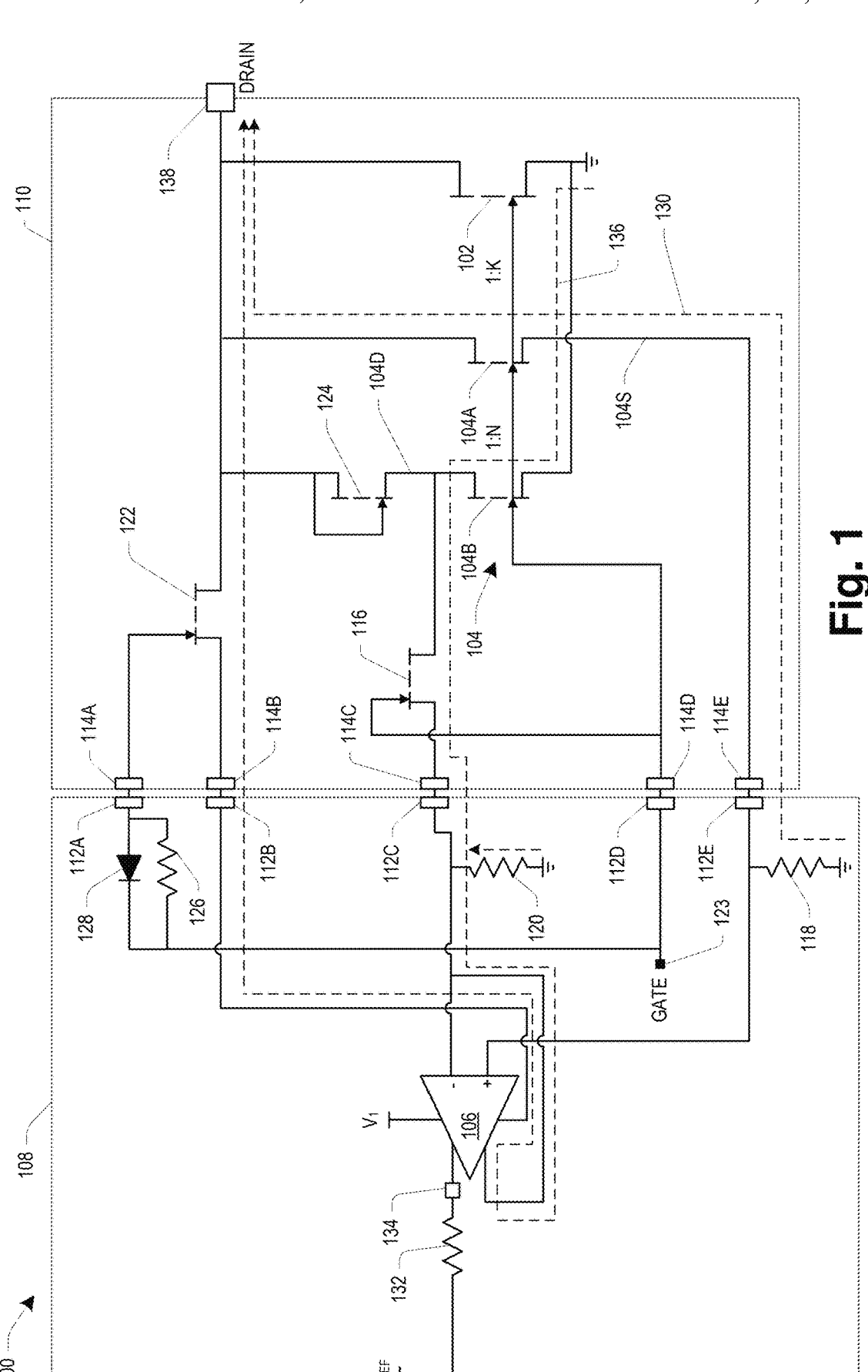
FIGS. 1-6 are schematic diagrams of load powering circuits, according to some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

Driver circuits are used to control power semiconductor devices to enable load current to be controlled. Current sensing may be provided to protect the power semiconductor device. Example applications include motor controls, inverters, power supplies, voltage converters, or some other application. In some embodiments, a load driving circuit comprises a power switch and current sensing amplifier. Current may flow in positive and negative directions through the power semiconductor device. For current flowing from the source of the power semiconductor device to the drain of the power semiconductor device (i.e., in the negative direction), the drain is used as a negative reference for the current sensing amplifier. When the term "ground" is used herein it refers to a low reference voltage, which may be at 0V, or some other low reference voltage, such as compared to a positive supply voltage.

Referring to FIG. 1 a schematic diagram of a load powering circuit 100 is provided, according to some embodiments. In some embodiments, the load powering circuit 100 comprises a power semiconductor device 102, a current mirror 104 comprising current mirror transistors 104A, 104B having a gain ratio of 1:N and a ratio 1:K between the power semiconductor device 102 and the current mirror transistor 104A, and a current sensing amplifier 106 that senses current in the current mirror transistor 104B proportional to the current through the power semiconductor device 102. In some embodiments, the current sensing amplifier 106 is provided on a driver die 108 comprising a driver circuit and the power semiconductor device 102 and the current mirror transistors 104A, 104B are provided on a power die 110 comprising a power circuit. Devices on the driver die 108 may be silicon based and devices on the power die 110 may be GaN based. Bond pads 112A, 112B, 112C, 112D, 112E on the driver die 108 are wire bonded to bond pads 114A, 114B, 114C, 114D, 114E on the power die 110. In some embodiments, the current sensing amplifier 106 is an operational transconductance amplifier (OTA).

In some embodiments, a non-inverting input ("+") of the current sensing amplifier 106 is connected to a source 104S of the current mirror transistor 104A and an inverting input ("−") of the current sensing amplifier 106 is connected to a drain 104D of the current mirror transistor 104B by a transistor 116. Current sense resistors 118, 120 are connected to the non-inverting input ("+") and the inverting input ("−") of the current sensing amplifier 106, respectively. In some embodiments, a positive reference terminal of the current sensing amplifier 106 is connected to a reference voltage, $V_1$, and a negative reference terminal of the current sensing amplifier 106 is connected to the drain of the power semiconductor device 102 by a transistor 122. A diode 124 (e.g., a diode-connected transistor) is connected between the drain 104D of the current mirror 104 and the drain of the power semiconductor device 102. In some embodiments, a protection resistor 126 is connected to a gate of the transistor 122 to reduce voltage stress on the gate of the transistor 122 and a diode 128 is provided in parallel with the protection resistor 126 to allow fast discharging of the gate of the transistor 122. In some embodiments, the transistor 122 is a normally OFF enhancement GaN device.

The gates of the power semiconductor device 102, the current mirror transistors 104A, 104B, the transistor 116, and the transistor 122 are controlled by a GATE signal provided at a gate driver terminal 123. In some embodiments, a gate driver provides the GATE signal. The transistor 122 blocks the high voltage at the drain of the power semiconductor device 102 from the current sensing amplifier 106 when the power semiconductor device 102 is off.

The bond pads 112A and 112D may be referred to as first and second gate control terminals, respectively, the bond pad 112B may be referred to as a drain power terminal, the bond pad 112C may be referred to as a drain mirror terminal, and the bond pad 112E may be referred to as a source mirror terminal.

A line 130 represents the current path when current flows through the power semiconductor device 102 in a positive direction (i.e., source to drain). A voltage across the current sense resistor 118 is sensed by the current sensing amplifier 106 proportional to the current in the power semiconductor device 102. The current sensing amplifier 106 generates a voltage drop across a sense resistor 132 that can be sensed at a pin 134. A line 136 represents the current path when current flows through the power semiconductor device 102 in a negative direction (i.e., drain to source). A voltage across the current sense resistor 120 is sensed by the current sensing amplifier 106 proportional to the current in the power semiconductor device 102. Using the drain of the power semiconductor device 102 as the negative reference for the current sensing amplifier 106 obviates the need for additional circuitry to provide the negative reference. In some embodiments, saturation of the power semiconductor device 102 is detected using comparators connected to the pad 114A or the sensed drain voltage at a pad 138.

Figure 2:
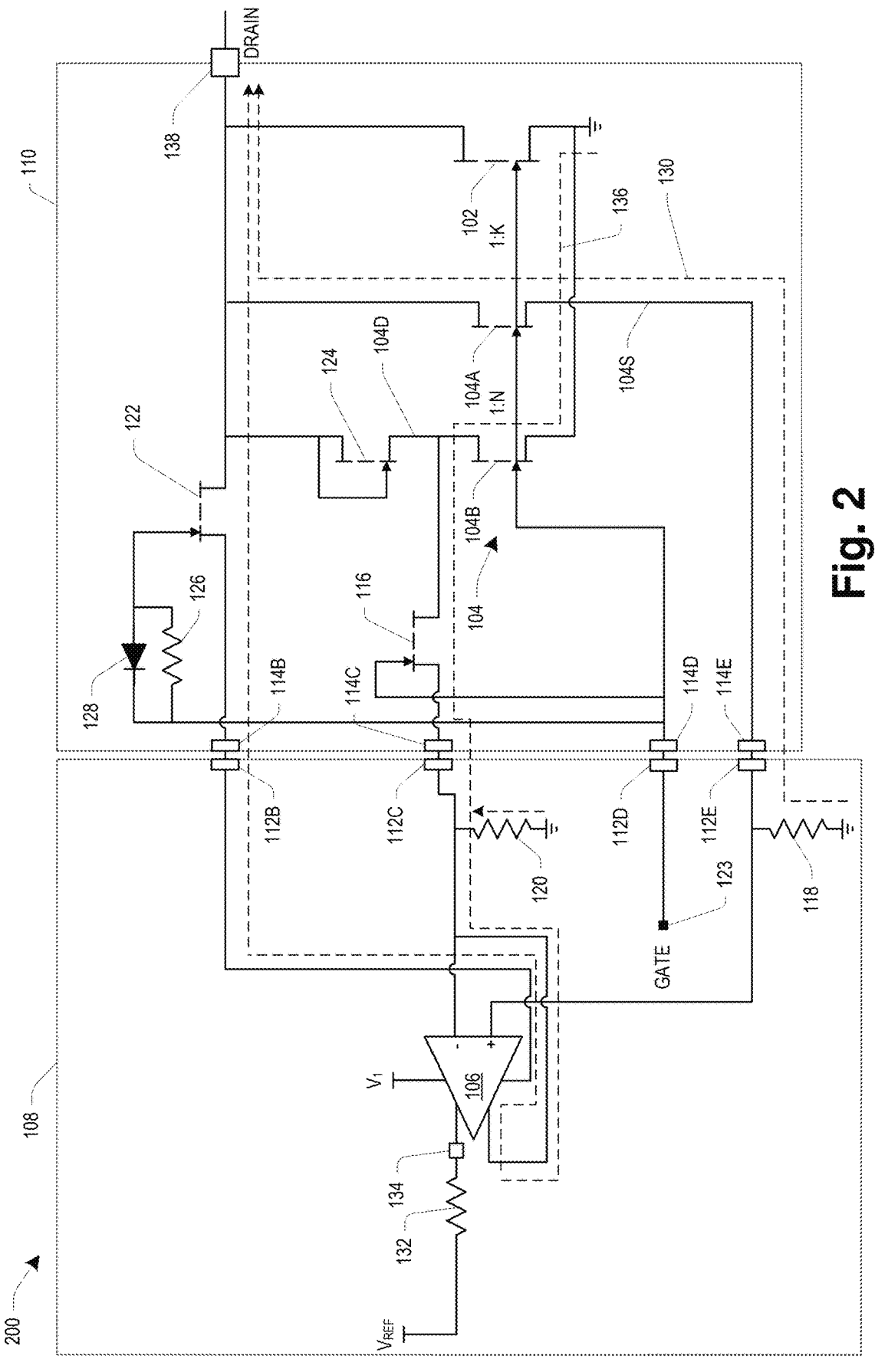

Referring to FIG. 2 a schematic diagram of a load powering circuit 200 is provided, according to some embodiments. In the embodiment of FIG. 2, the resistor 126 and the diode 128 are provided on the power die 110 instead of the driver die 108, obviating the need for the pads 112A, 114A and the bond wire.

Figure 3:
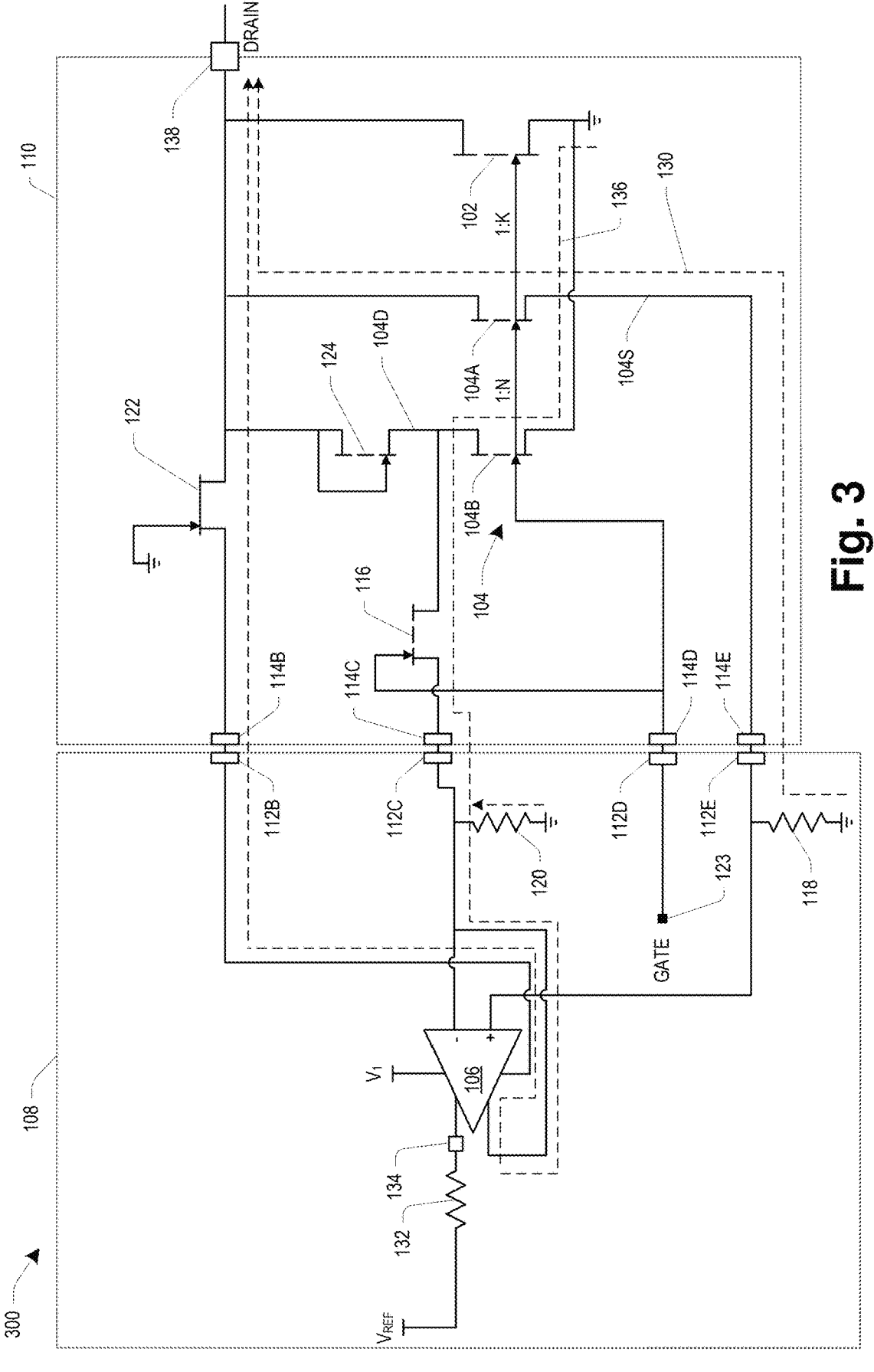

Referring to FIG. 3 a schematic diagram of a load powering circuit 300 is provided, according to some embodiments. In the embodiment of FIG. 3, the transistor 122 is a depletion device having a gate connected to ground. The load powering circuit 300 may be implemented using gate injection transistor (GIT) GaN devices of Schottky gate devices.

Figure 4:
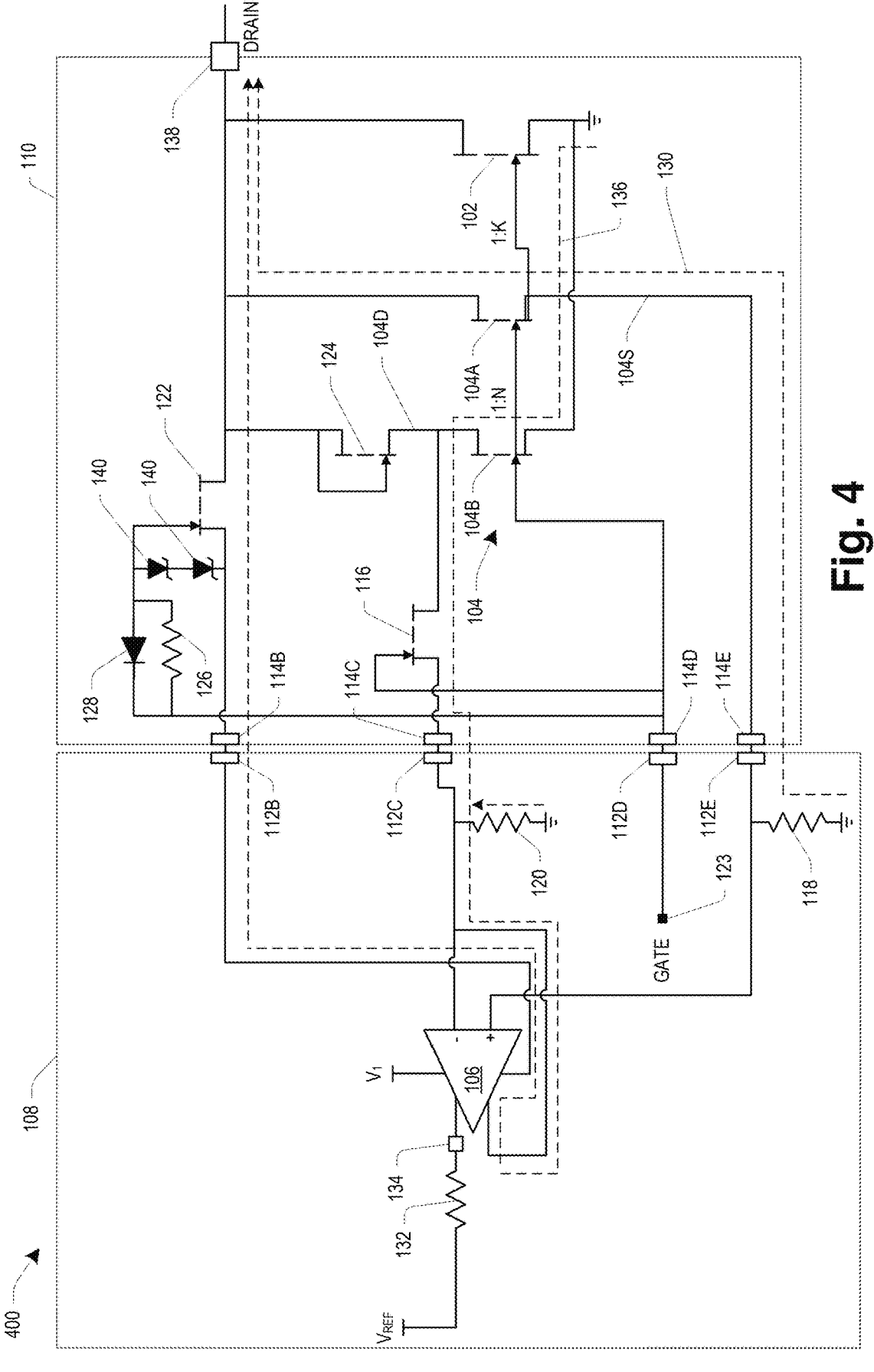

Referring to FIG. 4 a schematic diagram of a load powering circuit 400 is provided, according to some embodiments. In the embodiment of FIG. 4, Schottky gate devices are used for the transistors 102, 104A, 104B, 116, 122, 124, and one or more diodes 140 are connected to the gate of the transistor 122 and the source of the transistor 122 to prevent exceeding the maximum gate-source voltage of the transistor 122. The diodes 140 may be standard diodes or Zener diodes. In some embodiments, the resistor 126 and the diodes 128, 140 may be provided on the driver die 108.

Figure 5:
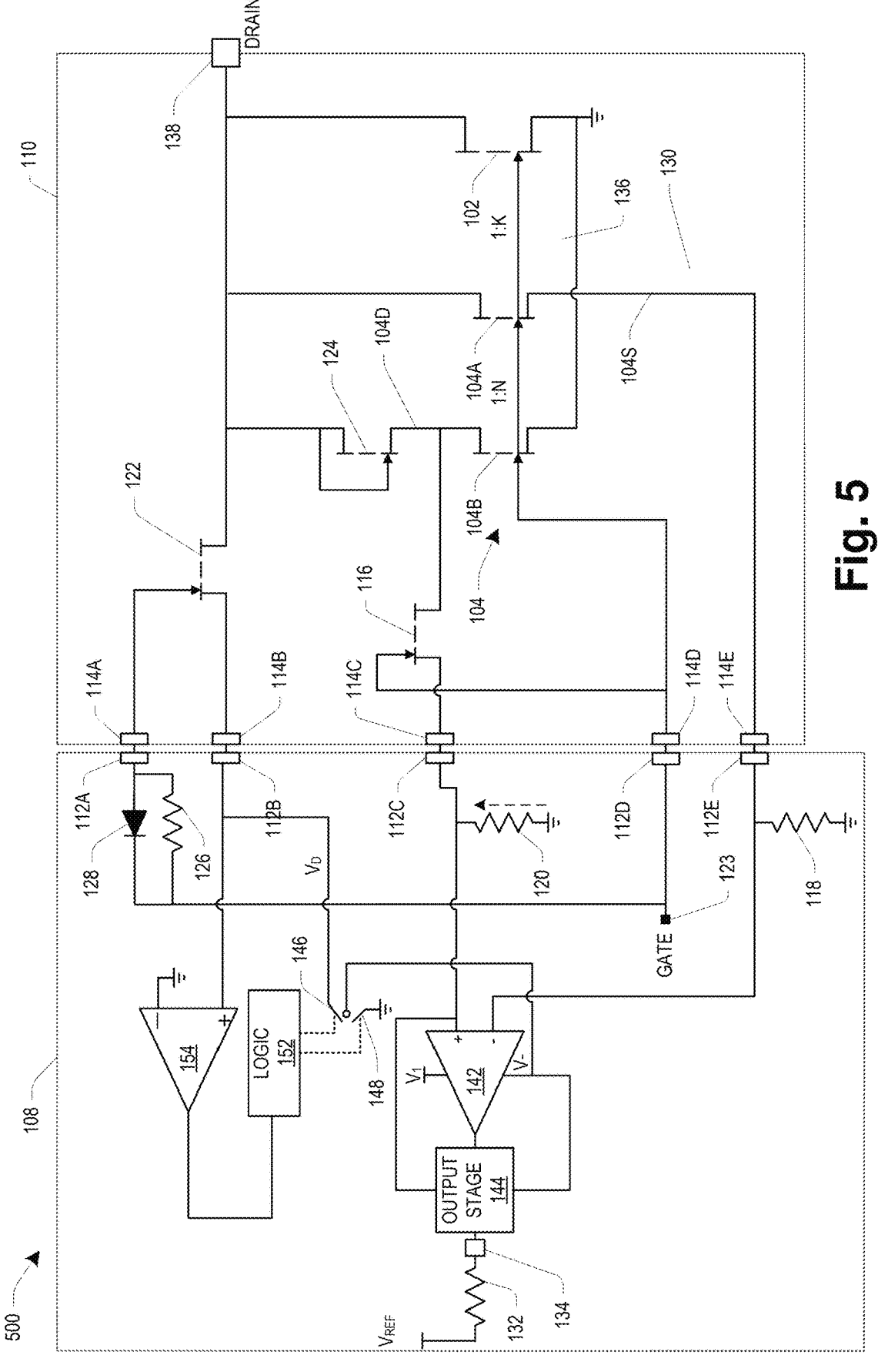

Referring to FIG. 5 a schematic diagram of a load powering circuit 500 is provided, according to some embodiments. In the embodiment of FIG. 5, the current is sensed by a current sensing amplifier 142 connected to an output stage 144. In some embodiments, the current sensing amplifier 142 has an inverting input ("−") connected to a source 104S of the current mirror transistor 104A and a non-inverting input ("+") connected to a drain 104D of the current mirror transistor 104B by the transistor 116. In some embodiments, a positive reference terminal of the current sensing amplifier 142 is connected to a reference voltage, $V_1$, and a negative reference terminal (V−) of the current sensing amplifier 106 is connected to switches 146, 148 controlled by logic 150. A comparator 154 senses the drain voltage ($V_D$). If the drain voltage ($V_D$) is less than ground, the logic 152 closes the switch 146 and opens the switch 148 to provide the drain voltage ($V_D$) at the negative reference terminal of the current sensing amplifier 142. If the drain voltage ($V_D$) is not less than ground, the logic 152 opens the switch 146 and closes the switch 148 to provide the ground at the negative reference terminal of the current sensing amplifier 142. In some embodiments, the output stage 144 is a class AB output stage where the output has the full output swing. The logic 152 provides proper a reference voltage for the output stage (e.g., V− or ground) depending on the current direction for proper operation.

Figure 6:
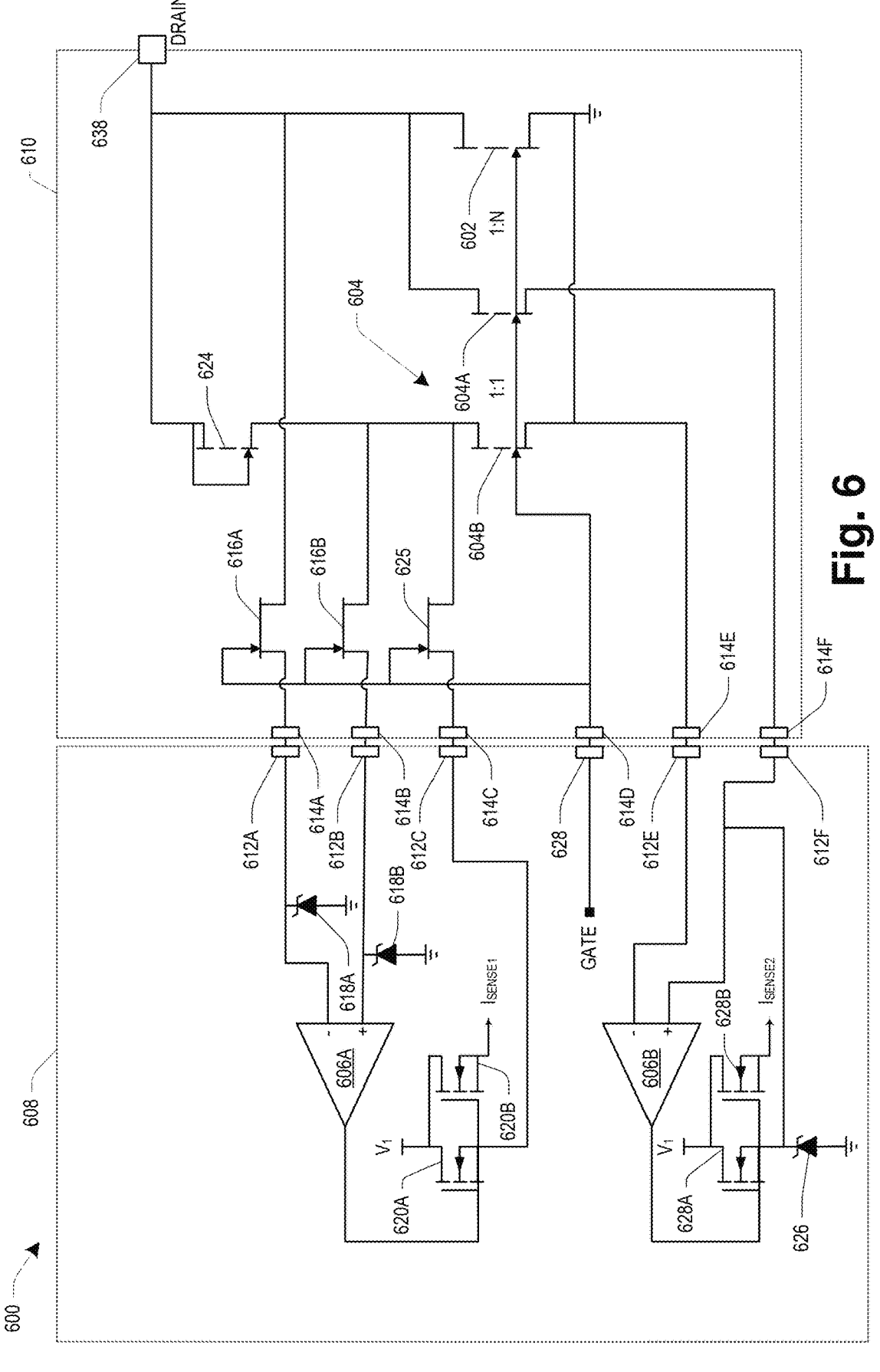

Referring to FIG. 6 a schematic diagram of a load powering circuit 600 is provided, according to some embodiments. In the embodiment of FIG. 6, the load powering circuit 600 comprises a power semiconductor device 602, a current mirror 604 comprising current mirror transistors 604A, 604B having a gain ratio of 1:1 and a gain ratio of 1:N with the power semiconductor device 602, and current sensing amplifiers 606A, 606B to sense current proportional to the current through the power semiconductor device 102. In some embodiments, the current sensing amplifiers 606A, 606B are provided on a driver die 608 comprising a driver circuit, and the power semiconductor device 602 and the current mirror transistors 604A, 604B are provided on a power die 610 comprising a power circuit. Devices on the driver die 608 may be silicon based and devices on the power die 610 may be GaN based. Bond pads 612A, 612B, 612C, 612D, 612E, 613F on the driver die 608 are wire bonded to bond pads 614A, 614B, 614C, 614D, 614E, 614F on the power die 610.

In some embodiments, an inverting input ("−") of the current sensing amplifier 606A is connected to the first sense transistor 616A and a non-inverting input ("+") of the current sensing amplifier 606A is connected to a second sense transistor 616B. The first sense transistor 616A is connected to a drain of the power semiconductor device 602 and the second sense transistor 616B is connected to a drain of the transistor 604B. Protection diodes 618A, 618B are connected to the inverting input ("−") and the non-inverting input ("+") of the current sensing amplifier 606A, respectively. In some embodiments, output transistors 620A, 620B have gates connected to the current sensing amplifier 606A to generate a current measurement ($I_{SENSE1}$). A diode 624 (e.g., a diode-connected transistor) is connected between the drain of the transistor 604B and the drain of the power semiconductor device 602. A force sense transistor 625 is connected between the drain of the current mirror transistor 604B and the output transistor 620A.

In some embodiments, an inverting input ("−") of the current sensing amplifier 606B is connected to drain of the transistor 604B and a non-inverting input ("+") of the current sensing amplifier 606A is connected to a drain of the transistor 604A. A protection diode 626 is connected to the non-inverting input ("+") of the current sensing amplifier 606B. In some embodiments, output transistors 628A, 628B have gates connected to the current sensing amplifier 606A to generate a current measurement ($I_{SENSE2}$).

The gates of the power semiconductor device 602, the current mirror transistors 604A, 604B, the sense transistors 616A, 616B, and force sense transistor 625 are controlled by a GATE signal provided at a gate driver terminal 628. In some embodiments, a gate driver provides the GATE signal.

In the load powering circuit 600, the sense transistors 616A, 616B match with the power semiconductor device 602, the sense transistor 616B is used for positive current flow sensing and the sense transistor 616A is used for negative current flow sensing. During the ON phase with positive current flow the sense transistor 616A will have the same voltage as the drain of the power semiconductor device 602 through the force sense transistor 625 and the sense transistor 616B. During negative current flow the sense transistor 616A will also have the same source voltage as that of the power semiconductor device 602, enabling enhanced accuracy in both current directions over process, temperature, and aging affects without requiring a negative charge pump.

The current sensing amplifier 606A senses current proportional to the current in the power semiconductor device 602 for current flowing in the reverse direction (i.e., drain to source), and the current sensing amplifier 606B senses current proportional to the current in the power semiconductor device 602 for current flowing in the forward direction (i.e., source to drain).

According to some embodiments, a load powering circuit comprises a power circuit comprising a power semiconductor device, a mirror circuit connected to power semiconductor device and configured to generate a mirror current signal based on current flowing through the power semiconductor device, and a drain switch having an input connected to a drain of the power semiconductor device, and a driver circuit comprising an amplifier having a first input terminal and a second input terminal connected to the mirror circuit, and a gate control terminal connected to the power semiconductor device, the mirror circuit, and the drain switch, wherein the drain switch has an output connected to a negative reference terminal of the amplifier, and a voltage supply terminal is connected to a positive reference terminal of the amplifier.

According to some embodiments, the load powering circuit comprises a gate protection circuit connected to a gate of the drain switch.

According to some embodiments, the power circuit comprises the gate protection circuit.

According to some embodiments, the driver circuit comprises the gate protection circuit.

According to some embodiments, the gate protection circuit comprises a resistor connected to the gate of the drain switch, and a first diode connected to the gate of the drain switch in parallel with the resistor.

According to some embodiments, the gate protection circuit comprises a second diode connected to the gate of the drain switch and a source of the drain switch, wherein the resistor and the first diode are connected to the second diode.

According to some embodiments, the second diode comprises a Zener diode.

According to some embodiments, the driver circuit is implemented on a silicon semiconductor die, and the power circuit is implemented on a gallium nitride semiconductor die.

According to some embodiments, the load powering circuit comprises an output stage connected to the amplifier, and logic configured to selectively connect a reference terminal of the output stage to one of ground or the output of the drain switch based on a voltage at the output of the drain switch.

According to some embodiments, the power circuit comprises a diode connected between a drain of the power semiconductor device and the current mirror.

According to some embodiments, a driver circuit comprises an amplifier, a gate control terminal, a source mirror terminal connected to a first input of the amplifier, a drain mirror terminal connected to a second input of the amplifier, a gate protection terminal, a gate protection circuit connected to the gate protection terminal and the gate control terminal, a drain mirror terminal connected to a negative reference terminal of the amplifier, and a voltage supply terminal connected to a positive reference terminal of the amplifier, wherein the amplifier is configured to measure a current flowing between the source mirror terminal and the drain mirror terminal responsive to a gate signal on the gate control terminal.

According to some embodiments, the driver circuit comprises a first sense resistor connected to the drain mirror terminal, and a second sense resistor connected to the drain mirror terminal.

According to some embodiments, the driver circuit comprising a sense resistor connected to an output of the amplifier.

According to some embodiments, the gate protection circuit comprises a resistor, and a diode connected in parallel with the resistor.

According to some embodiments, the gate protection circuit comprises a diode connected to the gate protection terminal.

According to some embodiments, a load powering circuit comprises a power circuit comprising a power semiconductor device, a mirror circuit connected to power semiconductor device and configured to generate a mirror current signal based on current flowing through the power semiconductor device, a first sense transistor having an input connected to a drain of the power semiconductor device, and a second sense transistor having an input connected to a drain of the current mirror, and a driver circuit comprising a first amplifier having a first input terminal connected to the first sense transistor and a second input terminal connected to the second sense transistor and generating an output based on a negative current flowing through the power semiconductor device, and a second amplifier having a first input terminal and a second input terminal connected to the mirror circuit and generating an output based on a positive current flowing through the power semiconductor device.

According to some embodiments, the driver circuit is implemented on a silicon semiconductor die, and the power circuit is implemented on a gallium nitride semiconductor die.

According to some embodiments, the driver circuit comprises a first output transistor having a gate connected to the first amplifier, and a force sense transistor connected to the current mirror and the first output transistor.

According to some embodiments, the driver circuit comprises a second output transistor having a gate connected to the first amplifier and the first output transistor.

According to some embodiments, the power circuit comprises a diode connected between a drain of the power semiconductor device and the current mirror.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" and/or the like is used herein to mean serving as an example, instance, illustration, etc., and not necessarily as advantageous. Rather, use of the word "example" and/or the like is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A load powering circuit, comprising:
   a power circuit, comprising:
      a power semiconductor device;
      a mirror circuit connected to the power semiconductor device and configured to generate a mirror current signal based on current flowing through the power semiconductor device; and
      a drain switch having an input connected to a drain of the power semiconductor device; and a driver circuit, comprising:

an amplifier having a first input terminal and a second input terminal connected to the mirror circuit; and a gate control terminal connected to the power semiconductor device, the mirror circuit, and the drain switch, wherein:

the drain switch has an output connected to a negative reference terminal of the amplifier; and a voltage supply terminal is connected to a positive reference terminal of the amplifier.

2. The load powering circuit of claim 1, comprising:

a gate protection circuit connected to a gate of the drain switch.

3. The load powering circuit of claim 2, wherein:

the power circuit comprises the gate protection circuit.

4. The load powering circuit of claim 2, wherein:

the driver circuit comprises the gate protection circuit.

5. The load powering circuit of claim 2, wherein:

the gate protection circuit comprises:

a resistor connected to the gate of the drain switch; and a first diode connected to the gate of the drain switch in parallel with the resistor.

6. The load powering circuit of claim 5, wherein:

the gate protection circuit comprises:

a second diode connected to the gate of the drain switch and a source of the drain switch, wherein:

the resistor and the first diode are connected to the second diode.

7. The load powering circuit of claim 6, wherein:

the second diode comprises a Zener diode.

8. The load powering circuit of claim 1, wherein:

the driver circuit is implemented on a silicon semiconductor die; and the power circuit is implemented on a gallium nitride semiconductor die.

9. The load powering circuit of claim 1, comprising:

an output stage connected to the amplifier; and logic configured to selectively connect a reference terminal of the output stage to one of ground or the output of the drain switch based on a voltage at the output of the drain switch.

10. The load powering circuit of claim 1, wherein:

the power circuit comprises:

a diode connected between a drain of the power semiconductor device and the current mirror.

11. A driver circuit, comprising:

an amplifier;

a gate control terminal;

a source mirror terminal connected to a first input of the amplifier;

a drain mirror terminal connected to a second input of the amplifier;

a gate protection terminal;

a gate protection circuit connected to the gate protection terminal and the gate control terminal;

a drain mirror terminal connected to a negative reference terminal of the amplifier; and a voltage supply terminal connected to a positive reference terminal of the amplifier, wherein the amplifier is configured to measure a current flowing between the source mirror terminal and the drain mirror terminal responsive to a gate signal on the gate control terminal.

12. The driver circuit of claim 11, comprising:

a first sense resistor connected to the drain mirror terminal; and a second sense resistor connected to the drain mirror terminal.

13. The driver circuit of claim 11, comprising:

a sense resistor connected to an output of the amplifier.

14. The driver circuit of claim 11, wherein:

the gate protection circuit comprises:

a resistor; and a diode connected in parallel with the resistor.

15. The driver circuit of claim 11, wherein:

the gate protection circuit comprises:

a diode connected to the gate protection terminal.

16. A load powering circuit, comprising:

a power circuit, comprising:

a power semiconductor device;

a mirror circuit connected to the power semiconductor device and configured to generate a mirror current signal based on current flowing through the power semiconductor device;

a first sense transistor having an input connected to a drain of the power semiconductor device; and a second sense transistor having an input connected to a drain of the current mirror; and a driver circuit, comprising:

a first amplifier having a first input terminal connected to the first sense transistor and a second input terminal connected to the second sense transistor and generating an output based on a negative current flowing through the power semiconductor device; and a second amplifier having a first input terminal and a second input terminal connected to the mirror circuit and generating an output based on a positive current flowing through the power semiconductor device.

17. The load powering circuit of claim 16, wherein:

the driver circuit is implemented on a silicon semiconductor die; and the power circuit is implemented on a gallium nitride semiconductor die.

18. The load powering circuit of claim 16, wherein:

the driver circuit comprises:

a first output transistor having a gate connected to the first amplifier; and a force sense transistor connected to the current mirror and the first output transistor.

19. The load powering circuit of claim 18, wherein:

the driver circuit comprises:

a second output transistor having a gate connected to the first amplifier and the first output transistor.

20. The load powering circuit of claim 16, wherein:

the power circuit comprises:

a diode connected between a drain of the power semiconductor device and the current mirror.

* * * * *